(12) United States Patent
Wang

(10) Patent No.: US 7,300,890 B1
(45) Date of Patent: Nov. 27, 2007

(54) METHOD AND APPARATUS FOR FORMING CONFORMAL $SIN_X$ FILMS

(75) Inventor: Qi Wang, Littleton, CO (US)

(73) Assignee: Midwest Research Institute, Kansas City, MO (US)

( * ) Notice: Subject to any disclaimer, the term of this patent is extended or adjusted under 35 U.S.C. 154(b) by 301 days.

(21) Appl. No.: 10/621,712

(22) Filed: Jul. 17, 2003

(51) Int. Cl.
*H01L 21/31* (2006.01)
*H01L 21/469* (2006.01)

(52) U.S. Cl. ............... 438/791; 438/775; 257/E21.293

(58) Field of Classification Search ................ 438/758, 438/775, 791
See application file for complete search history.

(56) References Cited

U.S. PATENT DOCUMENTS

| 5,112,466 | A | 5/1992 | Ohta et al. |
| 6,124,186 | A | 9/2000 | Molenbroek |
| 6,214,706 | B1 | 4/2001 | Madan et al. |
| 6,355,582 | B1 | 3/2002 | Hosoda et al. |
| 6,806,149 | B2 * | 10/2004 | Bu et al. .................... 438/299 |
| 2002/0123245 | A1 | 9/2002 | Tsujita et al. |
| 2002/0137363 | A1 | 9/2002 | Thakur |
| 2002/0142624 | A1 | 10/2002 | Levy et al. |
| 2002/0189545 | A1 * | 12/2002 | Matsumura et al. ........ 118/724 |

OTHER PUBLICATIONS

Osono et al, Coverage Properties of Silicon Nitride Film Prepared by the Cat-CVD Method, Thin Films, Apr. 2003, Apr. 2003.*
Osono, S. et al., Elsevier Thin Solid Films 430 (2003) 165-169.

* cited by examiner

*Primary Examiner*—Alexander Ghyka
(74) *Attorney, Agent, or Firm*—Paul J. White

(57) ABSTRACT

A silicon nitride film formation method includes: Heating a substrate to be subjected to film formation to a substrate temperature; heating a wire to a wire temperature; supplying silane, ammonia, and hydrogen gases to the heating member; and forming a silicon nitride film on the substrate.

17 Claims, 2 Drawing Sheets

METHOD AND APPARATUS FOR FORMING CONFORMAL SIN$_X$ FILMS

CONTRACTUAL ORIGIN OF THE INVENTION

The United States Government has rights in this invention pursuant to Contract No. DE-AC36-99GO10337 between the U.S. Department of Energy and the Midwest Research Institute.

TECHNICAL FIELD

This invention relates to film forming processes in general and more specifically to methods and apparatus for forming silicon nitride films.

BACKGROUND ART

Silicon nitride films are known and are being used in a wide variety of applications including, for example, the fabrication of electronic circuits and devices, as well as to provide surface protection and/or passivation for electronic devices and other materials. Silicon nitride films may be formed by Chemical Vapor Deposition (CVD) processes using, for example, as source gases, dichlorosilane (SiCl$_2$H$_2$) and ammonia (NH$_3$). Chemical Vapor Deposition (CVD) is a process whereby a solid material is deposited from a vapor by a chemical reaction that occurs on or nearby a heated substrate. The solid material is obtained as a coating, a powder, or as single crystals.

One problem with known methods for forming silicon nitride films relates to poor conformal or "step" coverage on substrates containing small features. While such poor conformal coverage is generally undesirable, it usually has been not been a problem for the relatively large scales (i.e., sizes) of electronic circuits and devices fabricated to date. However, the ability to fabricate ever small circuits and devices, such as those associated with ultra-large scale integrated (ULSI) circuitry, is beginning to be hampered by the limited ability of known deposition methods to provide sufficiently conformal silicon nitride coatings. Stated another way, the inability to form sufficiently conformal silicon nitride coatings is beginning to be an impediment to the development of smaller and/or higher density circuit devices and elements.

DISCLOSURE OF INVENTION

A silicon nitride film formation method includes: Heating a substrate to be subjected to film formation to a substrate temperature; heating a wire to a wire temperature; supplying silane, ammonia, and hydrogen gases to the heating member; and forming a silicon nitride film on the substrate.

Apparatus for forming a silicon nitride film on a substrate may comprise a process chamber. A substrate heater positioned within the process chamber is configured to receive the substrate. A wire positioned within the process chamber is heated to a wire temperature. A supply of silicon precursor material operatively associated with the process chamber provides a silicon precursor material to the process chamber. A supply of nitrogen precursor material operatively associated with the process chamber provides a nitrogen precursor material to the process chamber. A supply of process enhancement gas operatively associated with the process chamber supplies a process enhancement gas to the process chamber.

BRIEF DESCRIPTION OF THE DRAWINGS

Illustrative and presently preferred embodiments of the invention are shown in the accompanying drawing in which.

BEST MODES FOR CARRYING OUT THE INVENTION

Figure 1:
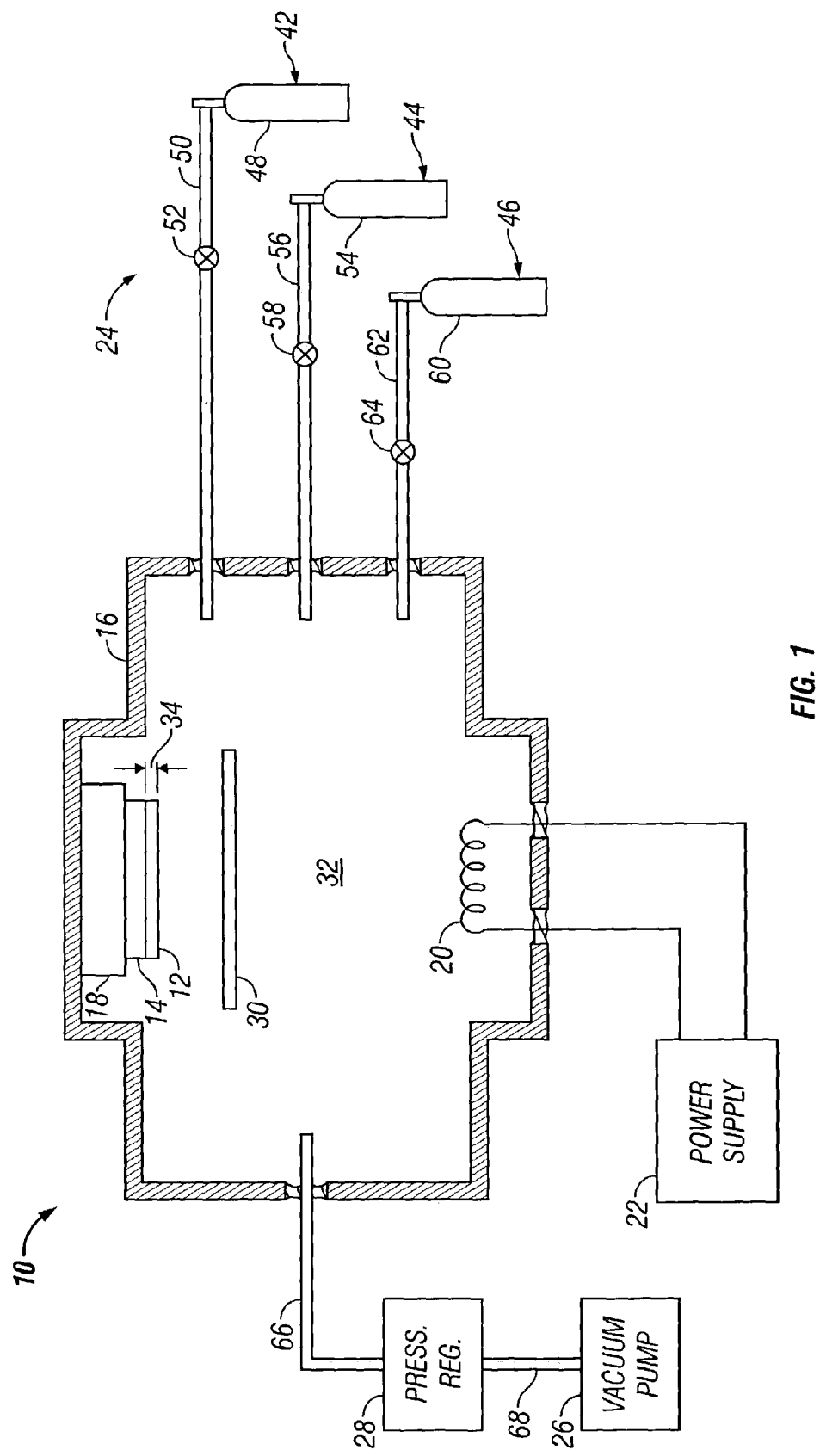
FIG. 1 is a schematic representation of apparatus for depositing a silicon nitride film according to one embodiment of the present invention.

Apparatus 10 for depositing a silicon nitride (i.e., SiN$_x$) film 12 on a substrate 14 according to one embodiment of the present invention is illustrated in FIG. 1 and may comprise a deposition or process chamber 16 containing the substrate 14 on which is to be formed or deposited the silicon nitride film 12. A substrate heater 18 in thermal contact with the substrate 14 heats the substrate 14 to a temperature suitable for the formation of the silicon nitride film 12 in accordance with the teachings provided herein. A wire or filament 20 provided within the process chamber 16 is electrically connected to a power supply 22. The power supply 22 is used to heat the wire 20 to the appropriate temperature, also in accordance with the teachings provided herein. A supply of process gases 24 is fluidically connected to the process chamber 16 and supplies to the chamber 16 process gases suitable for the formation of the silicon nitride film 12 according to the teachings of the present invention. By way of example, in one preferred embodiment, the process gases supplied by the supply of process gases 24 comprise silane (SiH$_4$), ammonia (NH$_3$), and hydrogen (H$_2$). A vacuum pump 26 and pressure regulator 28 are also fluidically connected to the process chamber 16 and maintain the internal pressure of the process chamber 16 within a predetermined range of process pressures suitable for carrying out the process of the present invention. It is generally preferred, but not required, that the deposition chamber 16 also be provided with a shutter assembly 30 to shield the substrate 14 from the filament 20 and reaction area 32. By operating the shutter assembly 30 to block or shield the substrate 14 from the filament 20 and reaction area 32 at the appropriate time, the shutter assembly 30 may be used to provide improved control of the thickness 34 of film 12.

The apparatus 10 may be operated as follows to deposit a silicon nitride film 12 on the substrate 14. Assuming that the process chamber 16 and various ancillary equipment and devices have been provided in the manner set forth above, the substrate heater 18 is activated to heat the substrate 14 to a temperature in the range of about 200° C. to about 400° C. (300° C. preferred). The power supply 22 is also activated to cause an electric current to flow through the filament 20. The electric current flowing in the wire 20 heats the wire 20 to a temperature in the range of about 1,800° C. to about 2,100° C. (2,000° C. preferred). At this point, the process gases from the supply of process gases 24 may be introduced into the process chamber 16. The vacuum pump 26 and pressure regulator 28 are operated to maintain the pressure inside the process chamber 16 at a pressure commensurate with the efficient formation of the silicon nitride film 12. By way of example, in one preferred embodiment, the process chamber 16 may be maintained at a pressure in the range of about 10 millitorr to about 50 millitorr (25 millitorr preferred). As mentioned above, the process gases may comprise silane, ammonia, and hydrogen. As will be described in greater detail below, the silane and ammonia gases are introduced in approximately stoichiometric amounts, although it is generally preferred to provide ammonia in slight excess of stoichiometric amounts. By way of example, in one preferred embodiment, the flow-rate of silane is about 2.5 standard cubic centimeters per minute (sccm), whereas the flow-rate of ammonia may be in the range of about 3 to 5 sccm. Hydrogen is also introduced into the process chamber 16 by the supply of process gases 24. Although not required for the formation of silicon nitride, it is generally believed that the introduction of additional amounts of hydrogen into the process chamber 16 is partly or even solely responsible for the superior conformal coverage of silicon nitride films (e.g., film 12) deposited in accordance with the teachings of the present invention. That is, without the addition of additional amounts of hydrogen, the films tend to be Si-rich. Adding additional amounts of hydrogen to the process is believed to significantly enhance the $NH_x$ radicals during film growth, resulting in the ability to produce high-quality, conformal $SiN_x$ films at low temperatures. Accordingly, in one preferred embodiment, hydrogen gas ($H_2$) is introduced at a flow rate of about 40 sccm. Operating the apparatus 10 in accordance with the foregoing parameters yield deposition rates of the silicon nitride film 12 in the range of about 1-2 Angstroms per second (Å/s).

It should be noted that the foregoing steps could be performed in other sequences since the order of the foregoing steps is not critical in achieving the objects and advantages of the present invention. For example, the flow of process gases could be initiated before heating the substrate 14 and/or filament 20 to the appropriate temperatures, particularly if a shutter assembly 30 is used to shield the substrate 14. In addition, the various process gases may be introduced in any order, or simultaneously. Consequently, the present invention should not be regarded as limited to performing the foregoing steps in any particular order.

Figure 2:
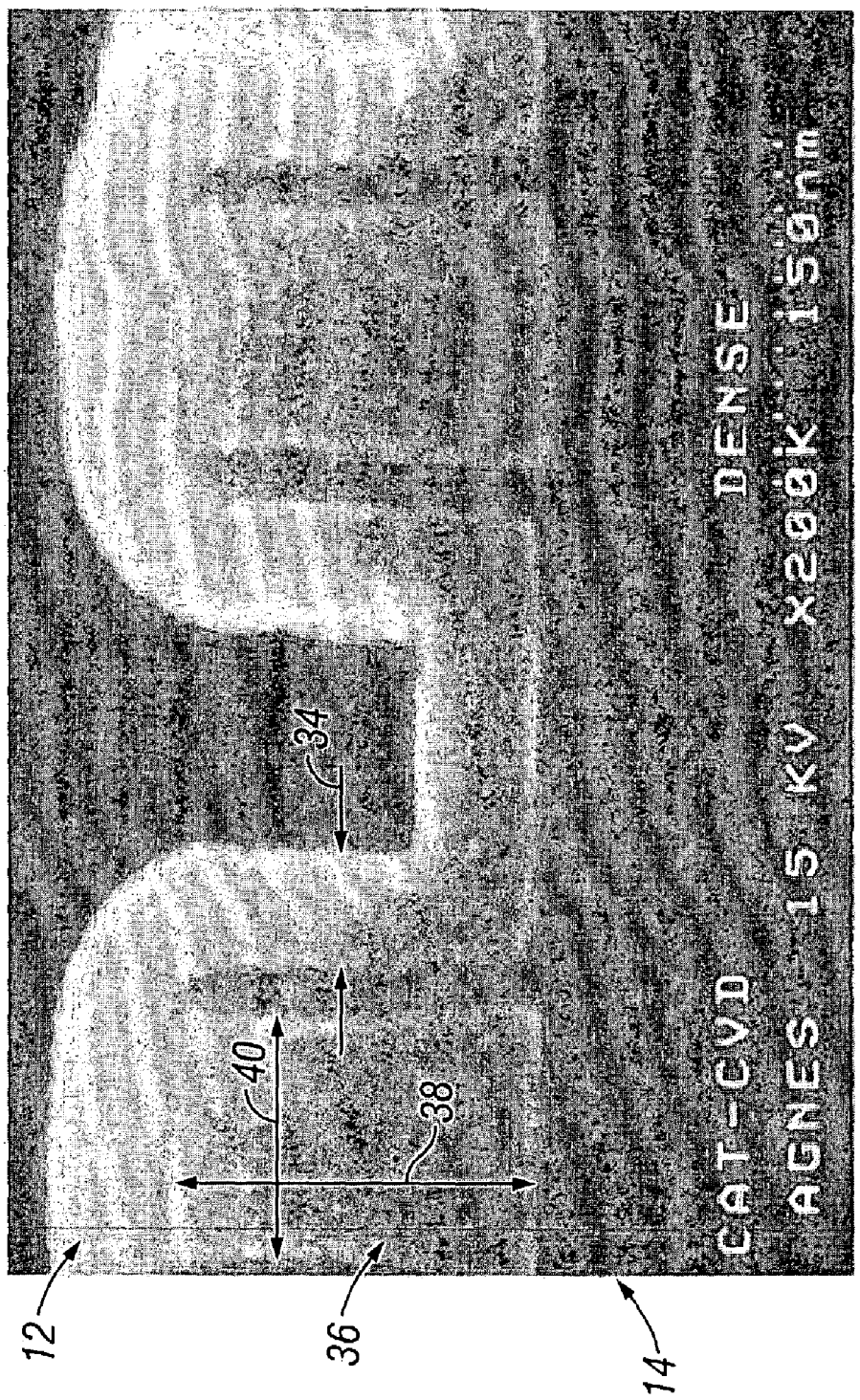
FIG. 2 is a scanning electron micrograph of a silicon nitride coating deposited in accordance with the teachings of the present invention.

As mentioned above, silicon nitride ($SiN_x$) films 12 deposited in accordance with the teachings of the present invention are highly advantageous in that they exhibit highly conformal, (i.e., step) coverage of very small-scale features which may be provided on the substrate 14. For example, and with reference now to FIG. 2, a silicon nitride film 12 having a thickness 34 of about 500 Å is shown deposited over metal traces 36 provided on a crystalline silicon substrate 14. The metal traces 36 have a height 38 of about 2,000 Å and a width 40 of about 1500 Å. As can be seen, the thickness 34 of film 12 is highly uniform, even on the vertical or side portions of the metal traces 36, providing nearly 100% step coverage.

A significant advantage of the method and apparatus of the present invention is that it may be used to produce highly-conformal silicon nitride coatings on a wide range of substrates. The silicon nitride coatings also may be formed at relatively low substrate temperatures, thereby increasing the numbers and types of substrates that may be coated without thermal damage to the substrate. In addition, because the present invention does not require plasma enhancement, the present invention also avoids plasma damage to the substrate and/or coating which is known to occur in certain types of plasma-enhanced chemical vapor deposition processes. In addition, the method and apparatus of the present invention achieves high deposition rates, and is readily scalable, thereby allowing the present invention to be advantageously utilized in large-scale and/or high capacity production environments.

Having briefly described one method and apparatus for producing silicon nitride films according to the present invention, as well as some of its more significant features and advantages, various embodiments of the present invention will now be described in detail. Referring back now to FIG. 1, one embodiment of apparatus 10 for depositing a silicon nitride (i.e., $SiN_x$) film 12 on a substrate 14 may comprise a process or deposition chamber 16 within which is provided a substrate heater 18 and a wire or filament 20. The process chamber 16 may comprise any of a wide variety of configurations and sizes depending on the size of the substrate 14 and/or the numbers of substrates 14 to be coated at one time. Of course, the process chamber 16 should also be configured to accommodate the substrate heater 18 and wire 20. By way of example, in one preferred embodiment, the process chamber 16 comprises a generally cylindrically-shaped structure sized to contain the various devices and to operate in conjunction with the various systems shown and described herein. Alternatively, of course, other configurations are possible. The process chamber 16 may be fabricated from stainless steel, although other materials could also be used. Therefore, the process chamber 16 of the present invention should not be regarded as limited to any particular configuration or any particular material.

The substrate heater 18 may be mounted at any convenient location within the process chamber 16 and may comprise any of a wide range of heating systems for heating substrates in vacuum processing systems that are well-known in the art or that may be developed in the future. Of course, the substrate heater 18 should be capable of heating and maintaining the substrate 14 at temperatures within the ranges specified herein. However, because substrate heaters (such as substrate heater 18) suitable for use with the present invention are well-known in the art and could be easily provided by persons having ordinary skill in the art, the particular substrate heater 18 that may be utilized in the present invention will not be described in further detail herein.

The wire or filament 20 may be mounted at any convenient location within the process chamber 16 by any of a wide range of mounting systems (not shown) known in the art for mounting hot filaments. Generally speaking, however, it is preferable to mount the wire 20 nearby the substrate 14 to be coated. The wire 20 may be fabricated from any of a wide range of materials suitable for the intended application. By way of example, in one preferred embodiment, the wire 20 is fabricated from tungsten, although other materials may be used. However, in considering the choice of materials for the wire 20, it should be noted that the wire 20 should be capable of being operated at the required temperature and over a reasonable time-span without significant damage. The relatively high filament temperatures involved (e.g., about 2,000° C.), will limit the wire 20 to materials capable of being operated at such temperatures, such as tungsten and various alloys thereof.

The wire 20 is connected to a power supply 22 which provides the energy required (i.e., via electric resistance heating) to heat the wire 20 to the required temperature. Accordingly, power supply 22 may comprise any of a wide range of types (e.g., AC or DC power supplies) having any of a wide range of power outputs that would be suitable for the intended application. Consequently, the present invention should not be regarded as limited to any particular type of power supply having any particular power capacity or output. However, by way of example, in one embodiment, the power supply 22 comprises an AC type power supply capable of providing a current of about 16 amperes at a voltage of about 11 volts. As will be discussed in greater detail below, supplying the wire 20 in one embodiment with this voltage and current will result in a wire temperature of about 2,000° C. Of course, larger power supplies will be required if the apparatus is to have increased capacity.

The process chamber 16 is fluidically connected to a process gas supply source 24 capable of providing the process gases in amounts sufficient for the intended application. More specifically, the types of gases supplied by the process gas supply source 24 include a silicon precursor material 42, a nitrogen precursor material 44, and process enhancement gas 46. As its name implies, the silicon precursor material 42 provides the silicon atoms required for the silicon nitride film 12. Examples of silicon precursor materials 42 include, but are not limited to $SiH_4$, $Si_2H_6$, and $SiH_2Cl_2$. The nitrogen precursor material 44 provides the nitrogen atoms required for the silicon nitride film 12. Examples of nitrogen precursor materials 44 include, but are not limited to $NH_3$ and $N_2$. The process enhancement gas 46 provides additional amounts of hydrogen to the process chamber 16. Such additional amounts of hydrogen are believed to contribute to the highly conformal nature of the silicon nitride film 12 produced by the apparatus and method of the present invention. In one preferred embodiment, the process enhancement gas comprises hydrogen.

Referring again to FIG. 1, the silicon precursor material 42 may be contained in a suitable reservoir 48 that is in fluid communication with the process chamber 16 via a suitable gas conduit 50. A valve 52 operatively associated with the gas conduit 50 and positioned between the reservoir 48 and the process chamber 16 may be used to control the flow of the silicon precursor material 42 into the process chamber 16. Alternatively, however, other configurations and devices for introducing the silicon precursor material 42 into the process chamber 16 may be used, as would be obvious to persons having ordinary skill in the art after having become familiar with the teachings of the present invention. Consequently, the present invention should not be regarded as limited to the particular delivery system for the silicon precursor material 42 that is shown and described herein.

The nitrogen precursor material 44 may be contained in a suitable reservoir 54 that is in fluid communication with the process chamber 16 via a suitable gas conduit 56. A valve 58 operatively associated with the gas conduit 56 and positioned between the reservoir 54 and the process chamber 16 is used to control the flow of the nitrogen precursor material 44 into the process chamber 16. Of course, and as was the case for the delivery system for the silicon precursor material 42, the delivery system for the nitrogen precursor material 44 may comprise any of a wide range of configurations and devices. Consequently, the present invention should not be regarded as limited to any particular type or configuration for the delivery system for the nitrogen precursor material 44.

The apparatus 10 for depositing a silicon nitride film 12 is also provided with a supply of process enhancement gas 46 (e.g., hydrogen). As discussed above, it is believed that the presence of excess amounts of hydrogen within the process chamber 16 contributes to the highly-conformal nature of the silicon nitride film 12. The process enhancement gas 46 may be provided to the process chamber 16 by any of a wide range of delivery systems that are known in the art or that may be developed in the future, as would be obvious to persons having ordinary skill in the art after having become familiar with the teachings of the present invention. Consequently, the present invention should not be regarded as limited to any particular type of system having any particular components for delivering the process enhancement gas 46 to the process chamber 16. However, by way of example, in one preferred embodiment, the process enhancement gas 46 may be contained in a reservoir 60 that is fluidically connected to the process chamber 16 via gas conduit 62. A valve 64 located in the gas conduit 62 and positioned between the reservoir 60 and the process chamber 16 may be used to regulate the flow of the process enhancement gas 46 into the process chamber 16.

The apparatus 10 for depositing a silicon nitride film 12 is also provided with a vacuum pump 26 and pressure regulator 28 that are fluidically connected in series to the interior of the process chamber 16 via suitable gas conduit members 66 and 68, respectively. The arrangement is such that the vacuum pump 26 and pressure regulator 28 may be set to maintain the internal pressure of the process chamber 16 at a process pressure or within a range of process pressures suitable for carrying out the method of the present invention. The vacuum pump 26 and pressure regulator 28 may comprise any of a wide variety of types that are now known in the art or that may be developed in the future having capacities sufficient for the intended application. Alternatively, other configurations comprising other devices may be used to ensure that the internal pressure of the process chamber 16 is maintained within the desired range, as would be obvious to persons having ordinary skill in the art after having become familiar with the teachings of the present invention. Consequently, the present invention should not be limited to any particular type of system or configuration for maintaining the pressure of the process chamber 16 within the desired range. Moreover, since such vacuum pumps (e.g., vacuum pump 26 and pressure regulators (e.g., pressure regulator 28) are well-known in the art and could be easily provided by persons having ordinary skill in the art after having become familiar with the teachings of the present invention, the particular vacuum pump 26 and pressure regulator 28 that may be utilized in the present invention will not be described in further detail herein.

It is generally preferred, but not required, that the apparatus 10 for depositing a silicon nitride film 12 also be provided with a shutter assembly 30 to shield the substrate 14 from the filament 20 and reaction area 32. The shutter assembly 30 may be operated at the appropriate time to block or shield the substrate 14 from the filament 20 and reaction area 32, thereby providing for improved control of the thickness 34 of film 12. However, because shutter assemblies, such as shutter assembly 30, for shielding substrates being coated in vacuum processes are well-known in the art and could be easily provided by persons having ordinary skill in the art, the particular shutter assembly 30 that may be utilized in one embodiment of the present invention will not be described in further detail herein.

The apparatus 10 may be operated in accordance with the following method to produce the silicon nitride film 12. As a first step in the process, the substrate heater 18 is activated to heat the substrate 14 to a temperature suitable for the formation of the silicon nitride film 12. Specifically, the substrate 14 should be heated to a temperature in the range of about 200° C. to about 400° C. (300° C. preferred). While temperatures within this range produce acceptable results, experiments indicate that higher substrate temperatures (i.e., temperatures nearer to 400° C.) generally result in silicon nitride films 12 having lower total bound hydrogen amounts (i.e., less than about 11 percent by weight), with generally higher N—H to Si—H ratios. Conversely, lower substrate temperatures (nearer to 200° C.) generally result in silicon nitride films 12 having somewhat higher total bound hydrogen amounts, with generally lower N—H to Si—H ratios.

The power supply 22 is also activated to cause an electric current to flow through the wire 20. The electric current flowing in the wire heats the wire 20 to a temperature in the range of about 1,800° C. to about 2,100° C. (2,000° C. preferred). If the wire 20 is made from tungsten or a tungsten alloy, it has been found that the silicon nitride film 12 will contain minimal amounts of tungsten metal contamination. Decreasing the temperature of the wire 20 to temperatures closer to 1,800° C. generally results in lower amounts of tungsten metal contamination and lower deposition rates.

After the substrate 14 and wire 20 have been heated to the appropriate temperatures, the process gases from the supply of process gases 24 may be introduced into the process chamber 16. The vacuum pump 26 and pressure regulator 28 are operated to maintain the pressure inside the process chamber 16 at a pressure commensurate with the efficient formation of the silicon nitride film 12. By way of example, in one preferred embodiment, the process pressure may be maintained at a pressure in the range of about 10 millitorr to about 50 millitorr (25 millitorr preferred). Higher pressures usually result in higher deposition rates and better film qualities. As discussed above, the process gases supplied by the supply of process gases 24 include a silicon precursor material 42, a nitrogen precursor material 44, and process enhancement gas 46. Examples of silicon precursor materials 42 include, but are not limited to $SiH_4$, $Si_2H_6$, and $SiH_2Cl_2$. In one preferred embodiment, the silicon precursor material 42 comprises gaseous $SiH_4$. Examples of nitrogen precursor materials 44 include, but are not limited to $N_2$ and $NH_3$. In one preferred embodiment, the nitrogen precursor material 44 comprises gaseous $NH_3$. The process enhancement gas 46 in one preferred embodiment comprises gaseous $H_2$.

The $SiH_4$ and $NH_3$ gases may be introduced into the process chamber 16 in approximately stoichiometric amounts. However, it is generally preferred that the process be conducted with ammonia in slight excess of stoichiometric amounts. By way of example, in one preferred embodiment, the flow-rate of $SiH_4$ is about 2.5 sccm, whereas the flow-rate of $NH_3$ may be in the range of about 3 to 5 sccm. As already discussed, it is generally believed, although not confirmed, that hydrogen dilution is partly or even solely responsible for the superior conformal coverage of silicon nitride films (e.g., film 12) deposited in accordance with the teachings of the present invention. Accordingly, in one preferred embodiment, hydrogen gas ($H_2$) is used as the process enhancement gas 46 and is introduced at a flow rate of about 40 sccm. Operating the apparatus 10 in accordance with the foregoing parameters yield deposition rates of the silicon nitride film 12 in the range of about 1-2 Angstroms/second (Å/s). If a shutter assembly 30 is provided, it may be opened and closed at the appropriate times to allow the silicon nitride film 12 to be deposited at the appropriate time and at the desired thickness.

As mentioned above, the order of the foregoing process steps is not critical in achieving the objects and advantages of the present invention. Therefore, the process steps could be performed in other sequences without departing from the teachings of the present invention. For example, the flow of process gases could be initiated before heating the substrate 14 and/or filament 20 to the appropriate temperatures. In addition, the various process gases may be introduced in any order, or simultaneously. Consequently, the present invention should not be regarded as limited to performing the foregoing steps in any particular order.

As mentioned above, silicon nitride ($SiN_x$) films 12 deposited in accordance with the teachings of the present invention are highly advantageous in that they exhibit highly conformal, (i.e., step) coverage of very small-scale features which may be provided on the substrate 14. For example, and with reference now to FIG. 2, a silicon nitride film 12 having a thickness 34 of about 500 Å is shown deposited over metal traces 36 provided on a silicon substrate 12. The metal traces 36 have a height 38 of about 2,000 Å and a width 40 of about 1500 Å. The thickness 34 of film 12 is highly uniform, even on the vertical or side portions of the metal traces 36, providing nearly 100% step coverage.

EXAMPLE

In this Example, a crystalline silicon substrate 14 having a plurality of metal traces 36 (FIG. 2) provided therein was coated with a silicon nitride film 12. The substrate 14 was placed in thermal contact with the substrate heater 18. The substrate heater 18 was then operated to heat the substrate 14 to a temperature of about 340° C. The power supply 22 was operated to heat a tungsten wire or filament 20 to a temperature of 2,000° C. At this point, the process chamber 16 was evacuated by the vacuum pump 26. The process gases from the supply of process gases 24 where then introduced into the process chamber 16 and allowed to raise the internal pressure of the process chamber 16 to a pressure of about 25 millitorr. The silicon precursor material 42 comprised gaseous $SiH_4$ and was introduced into the process chamber 16 at a flow rate of about 2.5 standard cubic centimeters per minute (sccm). The nitrogen precursor material 44 comprised gaseous $NH_3$ and was introduced into the process chamber 16 at a flow rate of about 3 sccm. The process enhancement gas 46, comprising gaseous hydrogen, was introduced into the process chamber 16 at a flow rate of about 40 sccm. The process was operated for about 7 minutes, resulting in the deposition of a highly conformal silicon nitride film 12 having a thickness 34 of about 500 angstroms.

It is readily apparent that the apparatus and process discussed herein may be used to produce large quantities of highly conformal silicon nitride films. Consequently, the claimed invention represents an important development in silicon nitride coating technology in general and to highly conformal silicon nitride film technology in particular. Having herein set forth preferred embodiments of the present invention, it is anticipated that suitable modifications can be made thereto which will nonetheless remain within the scope of the present invention. Therefore, it is intended that the appended claims be construed to include alternative embodiments of the invention except insofar as limited by the prior art.

The invention claimed is:

1. A silicon nitride film formation method, comprising:
heating a substrate to be subjected to film formation to a substrate temperature;
heating a wire to a wire temperature;
supplying silane, ammonia, and hydrogen gases to the heating member, wherein excess hydrogen gas is supplied in an amount sufficient to form a substantially 100% conformal silicon nitride film on the substrate, wherein the conformal silicon nitride film has a highly uniform thickness providing about 100% step coverage.

2. The method of claim 1, wherein the substrate temperature is in the range of about 200-400° C.

3. The method of claim 1, wherein the wire temperature is in the range of about 1800-2100° C.

4. The method of claim 1, further comprising conducting the silicon nitride film formation method at a pressure in the range of about 10-50 millitorr.

5. A method for forming a silicon nitride film, comprising:
providing a process chamber;
heating a substrate contained within the process chamber to a substrate temperature;
heating a wire contained within the process chamber to a wire temperature;
supplying a silicon precursor material to the process chamber;
supplying a nitrogen precursor material to the process chamber;
supplying a process gas to the process chamber in an amount sufficient to form a substantially 100% conformal silicon nitride film on the substrate, wherein the conformal silicon nitride film has a highly uniform thickness providing about 100% step coverage.

6. The method of claim 5, wherein the silicon precursor material is selected from the group consisting of $SiH_4$, $Si_2H_6$, and $SiH_2Cl_2$.

7. The method of claim 5, wherein the nitrogen precursor material is selected from the group consisting of $N_2$ and $NH_3$.

8. The method of claim 5, wherein the process gas comprises hydrogen.

9. The method of claim 5, wherein the substrate temperature is in the range of about 200-400° C.

10. The method of claim 5, wherein the wire temperature is in the range of about 1800-2100° C.

11. The method of claim 5, further comprising conducting the silicon nitride film formation method at a pressure in the range of about 10-50 millitorr.

12. The method of claim 1, wherein the conformal silicon nitride film has a highly uniform thickness.

13. The method of claim 1, wherein the conformal silicon nitride film has a highly uniform thickness on all side portions.

14. The method of claim 1, wherein the conformal silicon nitride film exhibits step coverage of very small-scale features on the substrate.

15. The method of claim 5, wherein the conformal silicon nitride film has a highly uniform thickness.

16. The method of claim 5, wherein the conformal silicon nitride film has a highly uniform thickness on top, bottom, and side portions.

17. The method of claim 5, wherein the conformal silicon nitride film exhibits step coverage of very small-scale features on the substrate.

* * * * *